United States Patent [19]

Anagnostopoulos et al.

[11] Patent Number: 5,349,215

[45] Date of Patent: Sep. 20, 1994

[54] ANTIBLOOMING STRUCTURE FOR SOLID-STATE IMAGE SENSOR

[75] Inventors: Constantine N. Anagnostopoulos, Mendon; Win-Chyi Chang, Penfield; Eric G. Stevens, Rochester; Georgia R. Torok, Fairport, all of N.Y.

[73] Assignee: Eastman Kodak Company, Rochester, N.Y.

[21] Appl. No.: 95,504

[22] Filed: Jul. 23, 1993

[51] Int. Cl.$^5$ ............................................. H01L 27/14
[52] U.S. Cl. ................................. 257/223; 257/229; 257/230; 257/231
[58] Field of Search ............... 257/223, 229, 230, 231, 257/232

[56] References Cited

U.S. PATENT DOCUMENTS

| | | | |
|---|---|---|---|
| 4,173,064 | 11/1979 | Farnow | 29/578 |
| 4,593,303 | 6/1986 | Dyck et al. | 357/24 |
| 4,613,402 | 9/1986 | Losee et al. | 156/643 |
| 4,975,777 | 12/1990 | Lee et al. | 348/314 |
| 4,995,061 | 2/1991 | Hynecek | 377/58 |
| 5,118,631 | 6/1992 | Dyck et al. | 437/29 |
| 5,122,850 | 6/1992 | Burkey | 357/24 |
| 5,130,774 | 7/1992 | Stevens et al. | 357/24 |

FOREIGN PATENT DOCUMENTS 63-14467 1/1988 Japan ................................... 257/231

OTHER PUBLICATIONS

Kosonocky et al, "Control of Blooming in Charge-Coupled Imagers," *RCA Review,* vol. 35, Mar. 1974, pp. 1-23.

*Primary Examiner*—William Mintel
*Attorney, Agent, or Firm*—Raymond L. Owens

[57] ABSTRACT

Solid-state image sensors, in general, comprise a photodetector for detecting radiation from the image and converting the radiation to charge carriers, and transfer means for carrying the charge carriers to an output circuit. One type of solid-state image sensor uses a CCD as both the photodetector and the transfer means. The solid-state image sensor generally includes a plurality of the CCD's arranged in spaced parallel relation to form an array. The image sensor of this disclosure utilizes only one antiblooming lateral overflow barrier. The excess signal charge of phase 1 flows into the preceding phase 2 and is saved. This eliminates the overflow barrier of phase 1 so that blooming protection is via the overflow barrier of the preceding phase 2. This results in an image sensor with blooming protection and increased charge capacity.

4 Claims, 3 Drawing Sheets

ANTIBLOOMING STRUCTURE FOR SOLID-STATE IMAGE SENSOR

TECHNICAL FIELD

The present invention relates to a charge-coupled device (CCD) solid-state image sensor having an antiblooming structure and, more particularly, to a lateral overflow drain antiblooming structure for a CCD solid-state image sensor.

BACKGROUND ART

Solid-state image sensors, in general, comprise a photodetector for detecting radiation from the image and converting the radiation to charge carriers, and transfer means for carrying the charge carriers to an output circuit. One type of solid-state image sensor uses a CCD as both the photodetector and the transfer means. The solid-state image sensor generally includes a plurality of the CCD's or pixels arranged in spaced parallel relation to form an area array. One problem which has arisen in this type of solid-state image sensor is known as "blooming." Blooming is a phenomenon that occurs when the number of charge carriers generated in a photodetector site by the incident radiation exceeds the storage capacity of the site. These excess charge carriers then spill over or "bloom" into adjacent photodetector sites thereby degrading and, in some cases, completely obliterating the integrity of the image.

To overcome this problem, various antiblooming structures have been developed and used in the sensors. One structure which has been used is a vertical-overflow drain which comprises a drain extending into the substrate in which the image sensor is formed into which the excess charge carriers flow. See U.S. Pat. No. 5,122,850.

Lateral-overflow drain (LOD) structures have also been used in solid-state image sensors. The lateral structure may comprise a drain which is positioned in the substrate in which the CCD is formed and extends along (i.e., laterally) a charge carrying channel region of the CCD. See U.S. Pat. No. 5,130,774 to Stevens et al.

DISCLOSURE OF INVENTION

The prior art image sensor related to this invention utilizes a lateral overflow antiblooming structure. The sensor has two overflow barriers per pixel. One each for phase 1 and phase 2. These imagers are operated in the accumulation mode. When the charge is larger than the amount of charge phase 1 can hold in accumulation, the excess charge spills over the overflow barrier and is lost. The net effect of the charge loss over the overflow barrier is a reduced charge capacity for the vertical pixels and, consequently, the imager.

Our invention eliminates the overflow barrier of phase 1 so that the only blooming protection is via the overflow barrier of the preceding phase 2. As a result, excess signal charge from phase 1 flows into the preceding phase 2 and is saved.

The major advantage of this invention is an assured increase in the charge capacity of the sensor and, consequently, an increased dynamic range without loss of performance.

BRIEF DESCRIPTION OF THE DRAWINGS

The details of the invention will be described along with the accompanying drawings.

DETAILED DESCRIPTION OF THE INVENTION INCLUDING THE BEST MODE OF CARRYING IT OUT

Figure 1:
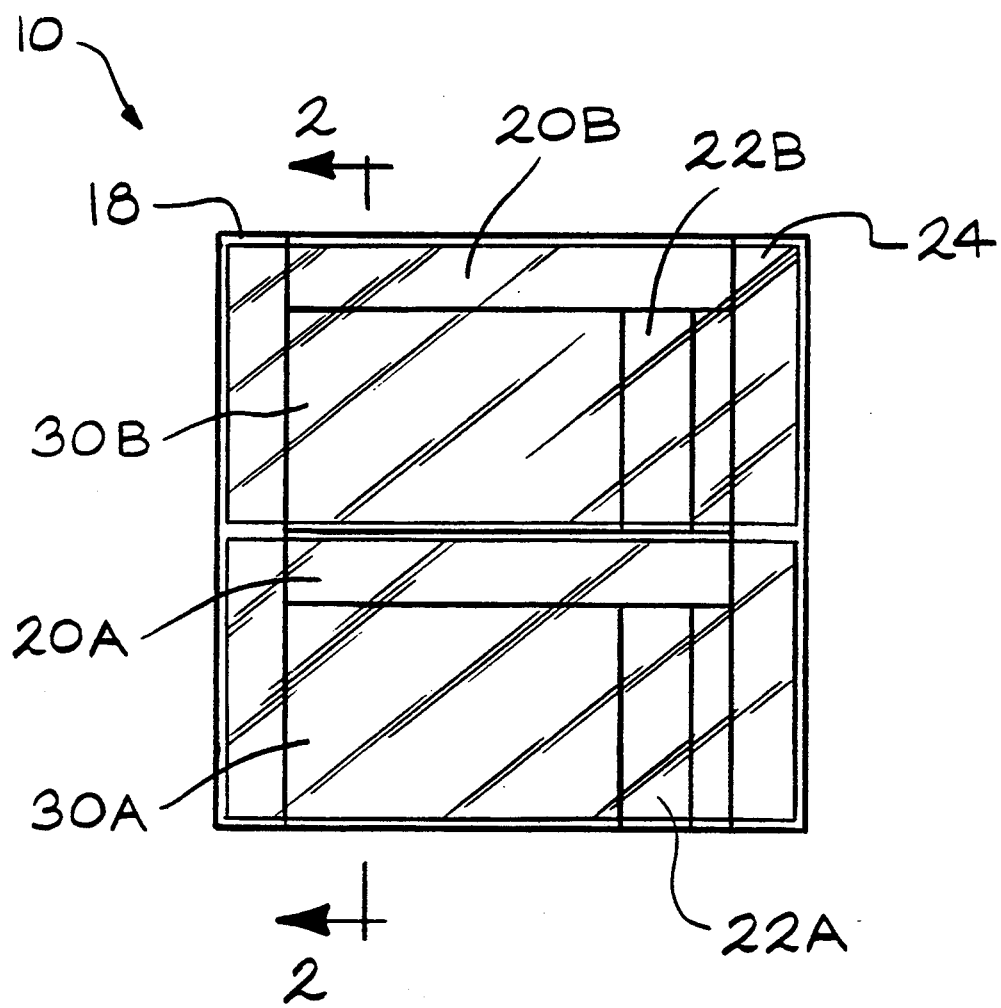
FIG. 1 is a top plan view of one pixel of a prior art solid-state image sensor.
Figure 2:
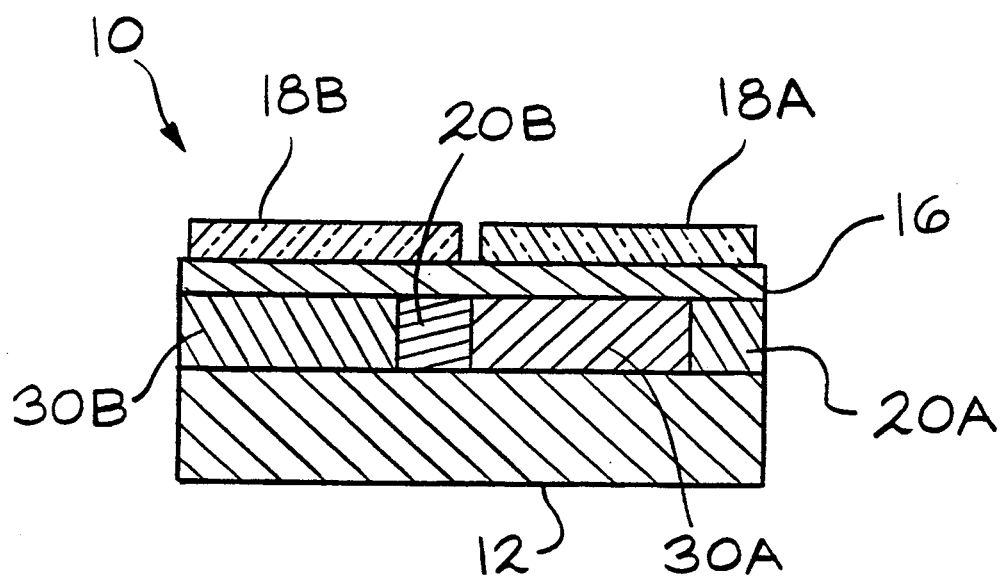
FIG. 2 is a sectional view taken along line 2—2 of FIG. 1.

Referring now to FIGS. 1 and 2, they show a pixel of a prior art CCD, solid-state image sensor. Pixel 10 includes semiconductor 12 of one conductivity type (p-type conductivity) of a semiconductor material, such as single-crystalline silicon. A CCD-channel region 30 of the opposite conductivity (n-type conductivity) is formed in the top surface of semiconductor 12. Any number of CCD's (not shown) are arranged in spaced parallel relation. Although, only one CCD is shown, a solid-state image sensor includes any number of CCDs depending on the size of sensor.

Each CCD or pixel comprises photodetector with two storage areas. In FIG. 1, they are storage area 30A (phase 1) and storage area 30B (phase 2). Between storage area 30A and 30B is barrier 20A. Between storage area 30B (phase 2) and phase 1 of the adjacent CCD is barrier 20B. Adjacent to storage areas 30A and 30B is lateral overflow drain (LOD) 24. Between storage area 30A (phase 1) and LOD 24 is lateral antiblooming structure or overflow barrier 22A. Between storage area 30B (phase 2) and LOD 24 is lateral antiblooming structure or overflow barrier 22B. Overlaying each CCD are gate electrodes 18A and 18B. These may be made of a transparent material, such as indium-tin oxide or doped polycrystalline silicon. Between gate electrodes 18A and 18B and the silicon surface is gate dielectric 16 typically made of $SiO_2$.

FIG. 2 shows a rearrangement of storage areas 30A and 30B and of barriers 20A and 20B.

Figure 3:
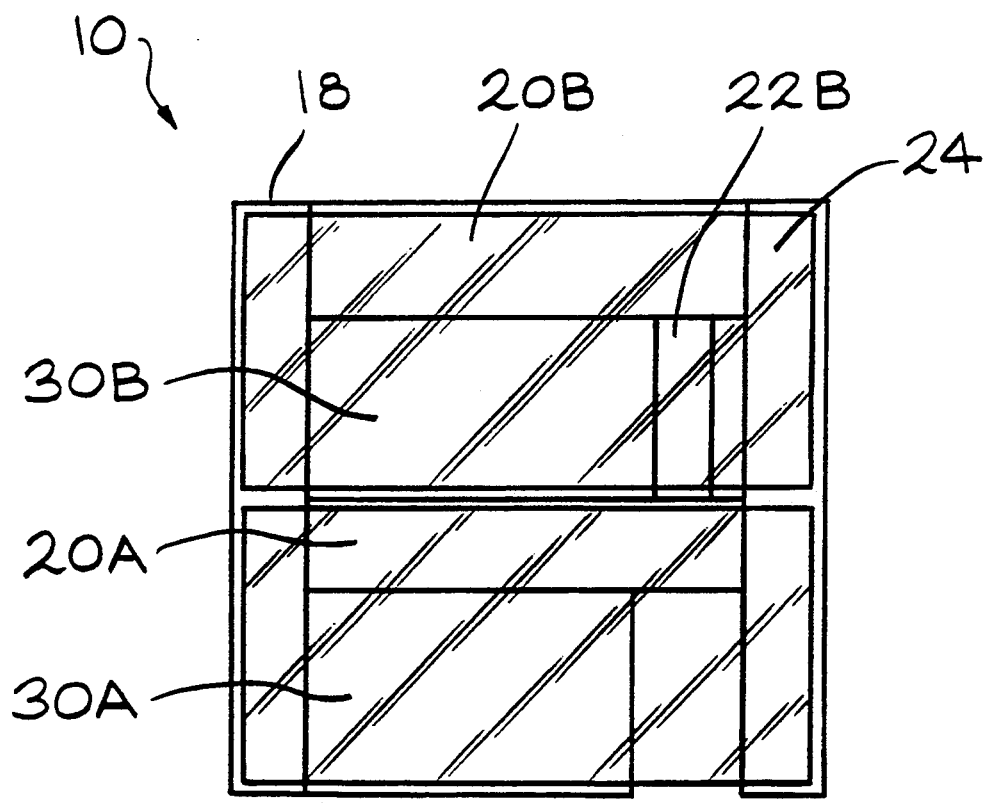
FIG. 3 is a top plan view of one pixel of the FIG. 1. solid-state image sensor of the present invention.

Referring now to FIG. 3, it shows the absence of barrier 22A between storage area 30A (phase 1) and LOD 26. Overflow barrier 22B now has a potential deeper than barrier 20B. Barrier 20A is deeper than barrier 20B so that excess signal charge in storage area 30A will flow into the preceding phase 2 (30B) and be saved.

The length of each overflow barrier 22B in FIG. 3, i.e., the distance across barrier 22B in the direction to LOD 24, is shorter than the length of barrier 20B, i.e., the distance across barrier 20B to the adjacent pixel. As a result, the potential of barrier 22B is deeper than that of barrier 20B. This insures that no blooming will occur since excess photocurrent from phase 1 (storage area 30A) will go into the preceding phase 2 (30B). Excess photocurrent from the preceding phase 2 (30B) then will go into the lateral overflow drain (24) via 22B.

Preferably, the barriers are formed by light p-type implants into an n-type buried channel. Preferably, the same n-type buried implants form the storage areas. U.S. Pat. No. 4,613,402 shows a process for fabricating these devices.

Preferably, barrier 22B has a narrow length ranging from 1.0 to 1.6 $\mu m$. Barriers 20B and 20A lengths range from 1.4 to 2.0 $\mu m$.

Thus, the present invention provides a solid-state image sensor having a plurality of CCDs, each of which serves to collect the imaging radiation and convert the radiation to charge carriers, and to transfer the charge carriers to an output circuit. The CCDs have a lateral-overflow drain which serves as an antiblooming structure. The lateral-overflow drain structure improves the modulation transfer function (MTF) and reduces horizontal crosstalk of the image sensor as a result of the collection of laterally diffusing photocarriers. The lateral-overflow drain provides an image sensor with good linearity and sharp turn-on.

This invention provides for the excess signal charge to flow into the preceding phase 2 and be saved. This invention eliminates the overflow barrier of phase 1 so that the only blooming protection is via the overflow barrier of the preceding phase 2. The overflow barrier of phase 2 has a potential deeper than the barrier between phase 2 and the adjoining pixel. Hence, this structure provides excellent blooming protection.

The invention has been described in detail with particular reference to certain preferred embodiments thereof, but it will be understood that variations and modifications can be effected within the spirit and scope of the invention.

PARTS LIST

10 Pixel
12 Semiconductor
16 Dielectric
18A Gate electrode
18B Gate electrode
20A Barrier
20B Barrier
22A Overflow barrier
22B Overflow barrier
24 Lateral overflow drain
30 CCD channel region
30A Storage area
30B Storage area

What is claimed is:

1. A solid-state image sensor comprising:
   (a) a substrate of a semiconductor material of one conductivity type having a top surface;
   (b) at least one photodetector in the top surface of the substrate, the photodetector having first and second storage areas, respectively;
   (c) a first barrier between said first and second storage areas;
   (d) a second barrier between the second storage areas and an adjacent photodetector wherein the second barrier is shallower than the first;
   (e) a lateral overflow drain (LOD) adjacent to the photodetector; and
   (f) an antiblooming overflow barrier between the LOD and only the second storage area, wherein the antiblooming barrier
      (i) has a potential deeper than the second barrier; and
      (ii) is a primary antiblooming path between the photodetector and the LOD.

2. The solid-state image sensor of claim 1 wherein the length of the antiblooming overflow barrier between the second storage area and the LOD is less than the length of the second barrier between the second storage area and an adjacent photodetector.

3. The solid-state image sensor of claim 1, wherein the length of the antiblooming overflow barrier between the second storage area and the LOD ranges from 1.0 to 1.6 $\mu$m and the length of second overflow barrier between the second storage area and an adjacent photodetector range from 1.4 to 2.0 $\mu$m.

4. The solid-state image sensor of claim 1, wherein the antiblooming overflow barrier between the second storage area and the LOD is the only antiblooming path between the photodetector and the LOD.

* * * * *